United States Patent
Schubert et al.

(10) Patent No.: US 10,431,714 B2
(45) Date of Patent: Oct. 1, 2019

(54) ENGINEERED SUBSTRATES FOR SEMICONDUCTOR DEVICES AND ASSOCIATED SYSTEMS AND METHODS

(71) Applicant: QROMIS, Inc., Santa Clara, CA (US)

(72) Inventors: Martin F. Schubert, Sunnyvale, CA (US); Cem Basceri, Los Gatos, CA (US); Vladimir Odnoblyudov, Danville, CA (US); Casey Kurth, Boise, ID (US); Thomas Gehrke, Boise, ID (US)

(73) Assignee: Qromis, Inc., Santa Clara, CA (US)

( * ) Notice: Subject to any disclaimer, the term of this patent is extended or adjusted under 35 U.S.C. 154(b) by 0 days.

(21) Appl. No.: 15/016,943

(22) Filed: Feb. 5, 2016

(65) Prior Publication Data
US 2016/0155893 A1 Jun. 2, 2016

Related U.S. Application Data

(62) Division of application No. 13/223,162, filed on Aug. 31, 2011, now Pat. No. 9,269,858.

(51) Int. Cl.
*H01L 27/15* (2006.01)
*H01L 29/04* (2006.01)
(Continued)

(52) U.S. Cl.
CPC ........ *H01L 33/0079* (2013.01); *H01L 33/007* (2013.01); *H01L 33/0062* (2013.01);
(Continued)

(58) Field of Classification Search
CPC .......... H01L 33/0079; H01L 21/76254; H01L 2221/68363; H01L 25/50; H01L 21/2007
See application file for complete search history.

(56) References Cited

U.S. PATENT DOCUMENTS 6,054,370 A * 4/2000 Doyle ............... H01L 21/76254
257/E21.568
6,191,007 B1 * 2/2001 Matsui ............. H01L 21/76243
257/E21.133
(Continued)

FOREIGN PATENT DOCUMENTS

WO 2010024987 3/2010

OTHER PUBLICATIONS

Cree, Inc. "Direct Attach DA1000™ LEDs Data Sheet", 5 pages, 2010, retrieved from the Internet, URL: http://www.cree.com/products/pdf/CPR3Es.pdf.
(Continued)

*Primary Examiner* — Bradley Smith
*Assistant Examiner* — David J Goodwin
(74) *Attorney, Agent, or Firm* — Kilpatrick Townsend & Stockton LLP

(57) ABSTRACT

Engineered substrates for semiconductor devices are disclosed herein. A device in accordance with a particular embodiment includes a transducer structure having a plurality of semiconductor materials including a radiation-emitting active region. The device further includes an engineered substrate having a first material and a second material, at least one of the first material and the second material having a coefficient of thermal expansion at least approximately matched to a coefficient of thermal expansion of at least one of the plurality of semiconductor materials. At least one of the first material and the second material is positioned to receive radiation from the active region and modify a characteristic of the light.

5 Claims, 7 Drawing Sheets

(51) Int. Cl.
*H01L 33/00* (2010.01)
*H01L 33/02* (2010.01)
*H01L 33/16* (2010.01)
*H01L 33/46* (2010.01)

(52) U.S. Cl.
CPC ...... *H01L 33/0066* (2013.01); *H01L 33/0075* (2013.01); *H01L 33/0095* (2013.01); *H01L 33/02* (2013.01); *H01L 33/16* (2013.01); *H01L 33/46* (2013.01)

(56) References Cited

U.S. PATENT DOCUMENTS

| | | | | |
|---|---|---|---|---|
| 6,323,108 | B1* | 11/2001 | Kub | H01L 21/76254 257/E21.568 |
| 6,486,499 | B1* | 11/2002 | Krames | H01L 33/38 257/103 |
| 6,497,763 | B2 | 12/2002 | Kub et al. | |
| 6,593,212 | B1 | 7/2003 | Kub et al. | |
| 6,887,753 | B2* | 5/2005 | Gonzalez | H01L 21/28512 257/303 |
| 7,132,691 | B1 | 11/2006 | Tanabe et al. | |
| 7,358,152 | B2 | 4/2008 | Kub et al. | |
| 7,399,649 | B2* | 7/2008 | Miyachi | H01L 33/0079 257/E21.001 |
| 7,429,750 | B2* | 9/2008 | Suehiro | H01L 33/20 257/222 |
| 7,535,100 | B2 | 5/2009 | Kub et al. | |
| 7,951,689 | B2* | 5/2011 | Akimoto | H01L 21/76254 438/455 |
| 2004/0142575 | A1* | 7/2004 | Brewer | H01L 21/6835 438/700 |
| 2006/0255341 | A1* | 11/2006 | Pinnington | B82Y 20/00 257/79 |
| 2007/0054474 | A1 | 3/2007 | Tracy et al. | |
| 2007/0252289 | A1* | 11/2007 | Brewer | B81C 3/002 257/797 |
| 2008/0079125 | A1* | 4/2008 | Lu | H01L 23/3735 257/675 |
| 2008/0121903 | A1 | 5/2008 | Hiramatsu et al. | |
| 2008/0149915 | A1 | 6/2008 | Mori et al. | |
| 2008/0179611 | A1 | 7/2008 | Chitnis et al. | |
| 2010/0026779 | A1* | 2/2010 | Yonehara | B41J 2/45 347/238 |
| 2010/0148198 | A1 | 6/2010 | Sugizaki et al. | |
| 2010/0227421 | A1 | 9/2010 | Neff et al. | |
| 2011/0095291 | A1 | 4/2011 | Quitoriano | |
| 2012/0037925 | A1* | 2/2012 | Sheen | C30B 29/16 257/79 |
| 2012/0273816 | A1* | 11/2012 | Yoshida | H01S 5/0217 257/94 |
| 2013/0049043 | A1 | 2/2013 | Schubert et al. | |
| 2013/0203195 | A1* | 8/2013 | Kim | H01L 33/005 438/33 |

OTHER PUBLICATIONS

International Search Report and Written Opinion dated Mar. 4, 2013 in International Application No. PCT/US2012/050787, 11 pages.

* cited by examiner

ENGINEERED SUBSTRATES FOR SEMICONDUCTOR DEVICES AND ASSOCIATED SYSTEMS AND METHODS

CROSS-REFERENCE TO RELATED APPLICATION

This application is a divisional of U.S. application Ser. No. 13/223,162, filed Aug. 31, 2011, which is incorporated herein by reference in its entirety.

TECHNICAL FIELD

The present technology is directed generally to engineered substrates for semiconductor devices, and associated systems and methods. Engineered substrates in accordance with the present technology are suitable for solid state transducers, including light emitting diodes.

BACKGROUND

Solid state transducer (SST) devices include light-emitting diodes ("LEDs"), organic light emitting diodes ("OLEDs"), and polymer light-emitting diodes ("PLEDS"). The energy efficiency and small size of solid state transducer devices has led to the proliferation of these devices in a multitude of products. Televisions, computer monitors, mobile phones, digital cameras, and other electronic devices utilize LEDs for image generation, object illumination (e.g., camera flashes) and/or backlighting. LEDs are also used for signage, indoor and outdoor lighting, traffic lights, and other types of illumination. Improved fabrication techniques for these semiconductor devices have both lowered device cost and increased device efficiency.

Solid state transducer devices and other semiconductor devices are often fabricated using epitaxial growth techniques. Typically, an epitaxial film is grown on a wafer or a substrate in a controlled process that includes elevated temperatures. In a heteroepitaxy process, the substrate and the epitaxial film are composed of different materials having dissimilar coefficients of thermal expansion (CTE). Under high temperature manufacturing conditions, the distinct CTEs of the differing materials can cause the substrate and the epitaxial film to expand or contract at significantly differing rates, which can result in stresses that bow or warp the substrate either during or after the growth of the epitaxial film. Bowing or warping the substrate during the growth of the epitaxial film can reduce the uniformity of the film and thereby reduce the performance of the semiconductor device manufactured with the film. Furthermore, bowed or warped wafers can complicate further processing of the semiconductor device. For example, semiconductor devices constructed on substrates using epitaxial growth techniques are often singulated in a later processing step to produce a multitude of semiconductor devices from a single assembly. Warping, delamination and/or other defects can lead to misalignments during the singulation process which in turn can cause defects in the semiconductor devices.

One conventional approach to reducing the negative effects of dissimilar CTEs is to increase the substrate thickness. However, this does not entirely eliminate the problem because the stresses can still lead to delamination of the film from the substrate, or smaller, but still consequential bowing or warping. In addition to the above-mentioned problems with the fabrication of semiconductor devices, and the resulting defects, existing substrates are often sacrificed, wasted or otherwise destroyed in the manufacturing process, thereby increasing the cost of the semiconductor devices. Accordingly, there is a need for a solid state transducer device and a method of fabrication that can avoid or mitigate these limitations.

DETAILED DESCRIPTION

Figure 1:
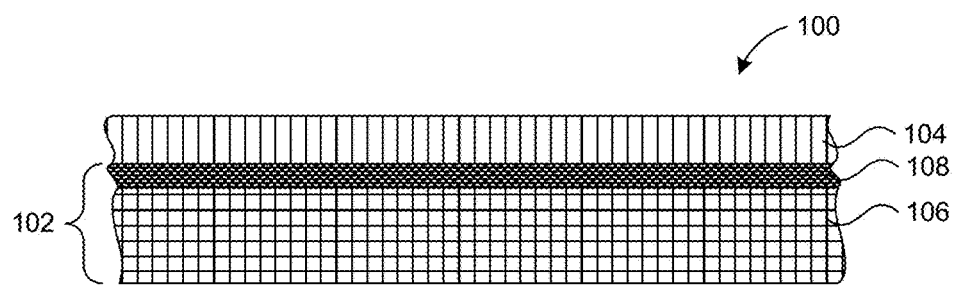
FIG. 1 is a partially schematic, cross-sectional illustration of a portion of a device assembly having an engineered substrate configured in accordance with an embodiment of the present technology.

Specific details of several embodiments of engineered substrates for semiconductor devices and associated systems and methods are described below. Several of these embodiments include solid state transducers ("SSTs") and in particular embodiments, solid state lighting (SSL) devices. Embodiments of the presently disclosed technology can include a variety of semiconductor devices, such as photocells, diodes, transistors, integrated circuits, etc. The term "SST" generally refers to solid state devices that include a semiconductor material as the active medium to convert electrical energy into electromagnetic radiation in the visible, ultraviolet, infrared, and/or other spectra. For example, SST devices include solid state light emitters (e.g., LEDs, laser diodes, etc.) and/or other sources of emission other than electrical filaments, plasmas, or gases. The term SST can also include solid state devices that convert electromagnetic radiation into electricity. Additionally, depending upon the context in which it is used, the term "substrate" can refer to a wafer-level substrate or to a singulated device-level substrate. A person skilled in the relevant art will also understand that the technology may have additional embodiments, and that the technology may be practiced without several of the details of the embodiments described below with reference to FIGS. 1-14.

Reference herein to "one embodiment", "an embodiment", or similar formulations, means that a particular feature, structure, operation, or characteristic described in connection with the embodiment, is included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments.

Engineered substrates in accordance with the present technology may be designed to provide several advantages over substrates that are commonly used for fabricating SSTs. The engineered substrate is generally composed of two or more separate materials that are chosen to enhance (e.g., optimize) certain chemical, physical and/or other properties that improve the fabrication or performance of SSTs that are formed on or with the engineered substrate. The coefficient of thermal expansion (CTE) of the materials, for example, may be chosen to improve the fabrication process. In another aspect of the present technology, in addition to enhancing the fabrication process, substrate materials can be chosen, and the engineered substrate can be constructed, such that the engineered substrate is retained as part of a final (e.g., end user) semiconductor device. An engineered substrate may be designed to operate as a lens, for example, in an SST device. The materials of the engineered substrate may be processed to provide other benefits to the fabrication process or the finalized SSTs. The engineered substrate may be patterned, for example, to reduce or minimize the stresses that occur during epitaxial growth. Several details and advantages of these and other embodiments are discussed further below.

FIG. 1 is a partially schematic, cross-sectional illustration of a portion of a device assembly 100 configured in accordance with an embodiment of the present technology. In the illustrated embodiment, the device assembly 100 includes an engineered substrate 102 and a semiconductor material 104. The semiconductor material 104 may be a compound including aluminum, indium, gallium, and/or nitrogen. In other embodiments, the semiconductor material may be comprised of other elements or compounds. The semiconductor material 104 can be formed via a variety of processes, including metal organic chemical vapor deposition ("MOCVD"), molecular beam epitaxy ("MBE"), liquid phase epitaxy ("LPE"), and/or hydride vapor phase epitaxy ("HVPE"). In other embodiments, at least a portion of the semiconductor material 104 may be formed using other suitable techniques, e.g., epitaxial growth techniques. During epitaxial growth of the semiconductor material 104, the engineered substrate 102 and the semiconductor material 104 may be exposed to a high temperature environment. Dissimilar CTEs between the engineered substrate 102 and the semiconductor material 104 can cause differing rates of expansion and contraction between the materials exposed to the high temperatures. This in turn can result in stresses that lead to bowing, warping, or delamination. Choosing materials with similar CTEs can reduce the stresses that occur during heating and subsequent cooling by making the expansion and contraction more uniform between the materials.

In the illustrated embodiment, the engineered substrate 102 includes a base or first material 106 and a top or second material 108. The engineered substrate 102 can be made from silicon, polycrystalline aluminum nitride, sapphire, and/or other suitable materials including both metals and non-metals. The first material 106 and the second material 108 may be chosen to provide, individually and/or in combination, a CTE that is at least approximately matched to the CTE of the semiconductor material 104. As used herein, at least approximately matched CTE means the material of the engineered substrate 102 has a CTE that exactly matches the CTE of a component of the semiconductor material 104, or depending upon the particular embodiments, differs from the CTE of the semiconductor material by a magnitude difference of less than 10%, less than 20% or less than 100%. For example, the first material 106 may be in the form of a sapphire or a silicon crystal wafer or another suitable material, e.g., a metal and/or a non-metal, and the second material 108 may be aluminum nitride. Gallium nitride and aluminum nitride have similar CTEs. Accordingly, in a representative engineered substrate 102 having gallium nitride as the semiconductor material 104 and aluminum nitride as the second material 108, the similar CTEs of the materials can reduce stresses during and/or after the epitaxial growth of the semiconductor material 104. In other embodiments, the engineered substrate 102 can include other combinations of materials that provide similar benefits. In one embodiment, for example, the first material 106 can be polycrystalline aluminum nitride, and the second material 108 can be silicon or a silicon compound.

In addition to dissimilar CTEs, the substrate material and the growth material in a heteroepitaxy process can also have dissimilar lattice structures. The different lattice structures can also produce stresses in the materials that lead to bowing, warping, and/or delamination problems. Furthermore, the different lattice structures can lead to gaps or irregularities in the interface between the materials. Therefore, in addition to or in lieu of the first material 106 and the second material 108 having CTEs similar to that of the semiconductor material 104, the first material 106 and/or the second material 108 in the illustrated embodiment can have a lattice structure that is engineered to reduce stresses in the device assembly 100.

Engineering the lattice structure of the first material 106 and the second material 108 can include selecting the materials to have lattice constants and/or other lattice parameters that reduce stresses in the device assembly 100, and/or can include physically manipulating the materials for enhanced (e.g., optimum) lattice matching. Accordingly, the first and/or second material 106, 108 can have a lattice parameter that at least approximately matches the corresponding lattice parameter of a subsequently-disposed material. As used herein, an at least approximately matched lattice parameter means the lattice parameter of the engineered substrate exactly matches that of the subsequently disposed material, or, depending upon the particular embodiment, differs from the lattice parameter of the subsequently disposed material by less than 5%, less than 10% or less than 20%.

In particular embodiments, the first material 106 or the second material 108 may be cut or ground at an angle selected to produce a particular alignment of the lattice structure at the exposed surface. As described above, the first material 106 may be in the form of a sapphire or silicon crystal wafer. Sapphire and silicon crystal wafers are generally cut from cylindrical boules. In most cases, the wafers are cut perpendicularly to the length of the boule. Cutting the cylindrical boule at an angle, or "miscutting," can produce a target or selected lattice structure orientation at the surface of the resulting wafer. In this manner, the first material 106 can be engineered to have a lattice orientation that is better matched to the second material 108. In particular embodiments, the first material 106 is a miscut silicon crystal that is cut at an angle of from about 2 degrees to about 5 degrees from perpendicular. In other embodiments, the miscut may be of a greater or lesser degree to provide a preferred lattice structure.

Miscutting can also be used to encourage and/or enhance nucleation for epitaxial materials grown on the engineered substrate 102. Similar to the miscutting for lattice matching described above, a cylindrical boule can be cut to produce a desired surface structure for nucleation. Generally, a relatively small miscut angle is used to establish a "staircase" at the miscut surface that provides nucleation sites. In some embodiments, the miscut angle can be less than or equal to 0.5 degrees. Miscutting can be used in combination with other techniques of the present disclosure, including buffer structure formation, as will be described further below.

Lattice matching the materials of the device assembly 100 can further include "pre-straining" the materials. The second material 108, for example, can be pre-strained before or after it is combined with the first material 106. Pre-straining can include imparting an internal stress in the material to more closely match the lattice structure of the material it is, or will be, combined with. In one embodiment, the internal stress is produced by bonding the materials together at an elevated temperature and then cooling the engineered substrate. In other embodiments, implanting additional materials can create an internal stress. In still further embodiments, the pre-straining can include facilitating oxidation to create the internal stress.

The first material 106 and the second material 108 of the engineered substrate 102 can be configured to have a variety of different thicknesses depending upon the application. In one embodiment, the second material 108 can be less than 1 micron thick while the first material is several hundred microns thick. By making the second material 108 comparatively thin, the effect of a mismatch between CTEs and/or lattice structures in the overlying materials of the device assembly 100 can be reduced.

Figure 2:
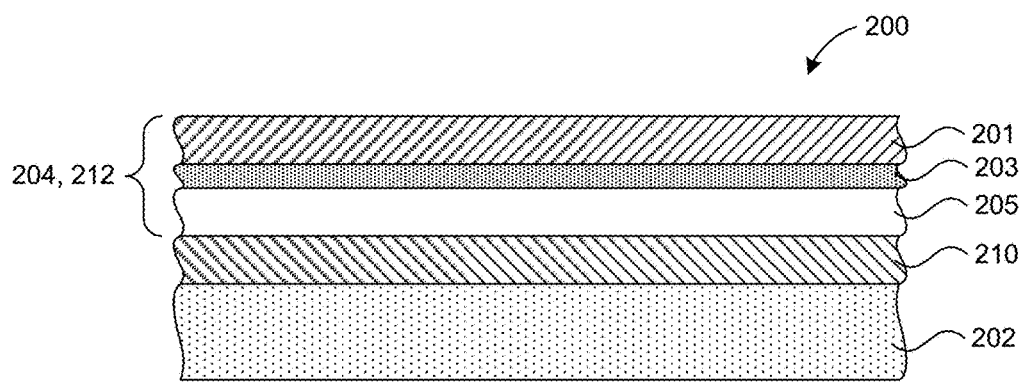
FIG. 2 is a partially schematic, cross-sectional illustration of a portion of a device assembly having a buffer structure and a transducer structure configured in accordance with another embodiment of the present technology.

In particular embodiments, engineering the first material 106 and the second material 108, by themselves, is sufficient to reduce stresses and provide improved conditions for heteroepitaxy. In other embodiments, additional materials are added to the device assembly 100 to further improve epitaxial growth. FIG. 2 is a partially schematic, cross-sectional illustration of a portion of a device assembly 200 having additional materials configured in accordance with an embodiment of the present technology. The device assembly 200 includes an engineered substrate 202, a buffer structure 210, and a semiconductor material 204. The engineered substrate 202 may be composed of two or more materials (not delineated in FIG. 2), as described above with reference to the device assembly 100. The buffer structure 210 can include one or more materials that further aid in improving the crystalline characteristics of the semiconductor material 204. For example, the buffer structure 210 can include several sequentially grown epitaxial films that in turn include aluminum, indium, gallium, and/or nitrogen. The buffer structure 210 can thereby provide additional CTE matching and/or lattice structure matching to further enhance the growth of the semiconductor material 204 and the quality of the device assembly 200. Additionally, as discussed above, nucleation of subsequent growth materials can be improved by miscutting. In particular embodiments, the engineered substrate 202 can include miscut materials that provide nucleation sites for the buffer structure 210. In such embodiments, the buffer structure 210 may require fewer epitaxial films to achieve a desired surface for subsequent epitaxial growth. In other embodiments, the buffer structure 210 can be used to supplement lattice matching (e.g., partial lattice matching) obtained when the engineered substrate 202 is miscut at a non-optimal angle. For example, if the target miscut angle is 5 degrees, but the engineered substrate 202 is miscut at 3 degrees, the buffer structure 210 can be used to achieve or approximately achieve lattice matching.

In the illustrated embodiment of FIG. 2, the semiconductor material 204 forms a transducer structure 212 having several different materials (e.g., layers). The transducer structure 212 can include a P-type semiconductor material 201, an N-type semiconductor material 205 and an active region 203 between the P-type material 201 and the N-type material 205. In one embodiment, the P-type material 201 is a P-type aluminum indium gallium nitride (P—AlInGaN), and the N-type material 205 is an N-type aluminum indium gallium nitride (N—AlInGaN). In other embodiments, the semiconductor materials 201 and 205 can individually include at least one of gallium arsenide (GaAs), aluminum gallium arsenide (AlGaAs), gallium arsenide phosphide (GaAsP), gallium (III) phosphide (GaP), zinc selenide (ZnSe), boron nitride (BN), aluminum gallium nitride (AlGaN), and/or other suitable semiconductor materials. The device assembly 200 can be processed to create individual die (not shown) with the transducer structure 212 singulated into individual SSTs, e.g., light-emitting diodes.

The active region 203 can include a single quantum well ("SQW"), multiple quantum wells ("MQWs"), and/or a bulk semiconductor material. The term "bulk semiconductor material" generally refers to a single grain semiconductor material (e.g., InGaN) with a thickness of from approximately 10 nanometers to approximately 500 nanometers. In certain embodiments, the active region 203 can include an InGaN SQW, GaN/InGaN MQWs, and/or an InGaN bulk material. In other embodiments, the active region 203 can include aluminum gallium indium phosphide (AlGaInP), aluminum gallium indium nitride (AlGaInN), and/or other suitable materials or configurations.

Figure 3:
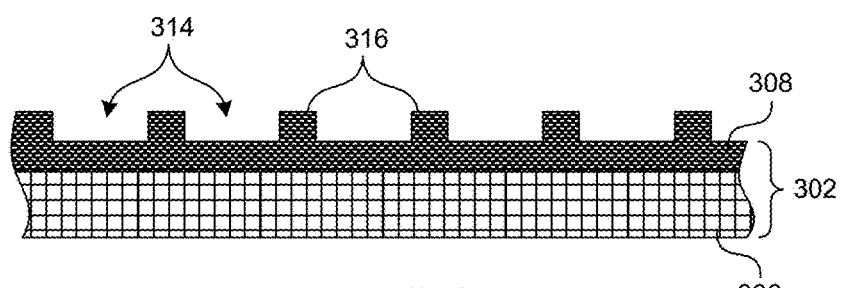
FIG. 3 is a partially schematic, cross-sectional illustration of a portion of a patterned engineered substrate configured in accordance with yet another embodiment of the present technology.
Figure 4:
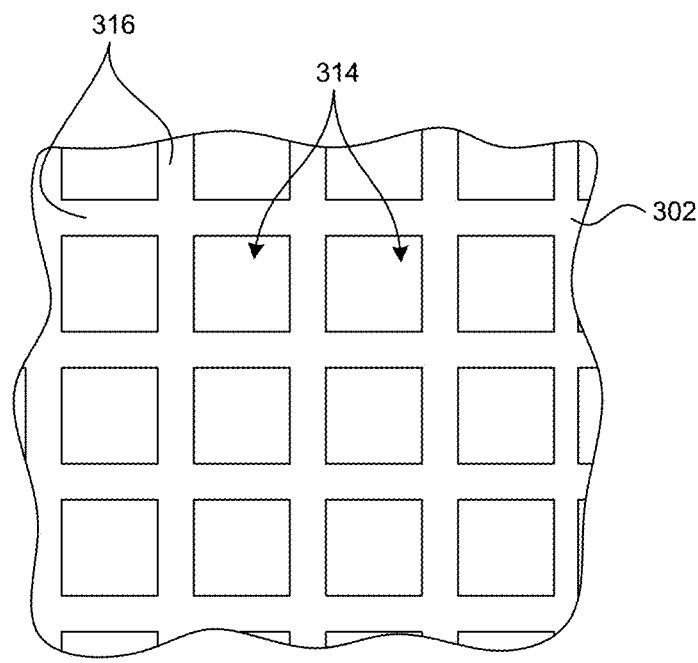
FIG. 4 is a partially schematic, top plan view of the engineered substrate of FIG. 3.

FIG. 3 is a partially schematic, cross-sectional illustration of a portion of a patterned engineered substrate 302 having a first material 306 and a second material 308 configured in accordance with another embodiment of the present technology. In this embodiment, the engineered substrate 302 is patterned to further reduce stresses in the substrate 302 and/or devices fabricated on the substrate 302. Accordingly, the patterned engineered substrate 302 can include a plurality of recesses 314 separated by raised portions or projections 316. FIG. 4 is a partially schematic, top plan view of the engineered substrate 302 of FIG. 3. Referring to FIGS. 3 and 4 together, the recesses 314 and the raised portions 316 form a waffle pattern with the raised portions 316 surrounding individual recesses 314 on all sides. The recesses 314 can be formed by positioning a mask (not shown) over the areas above the raised portions 316 and etching (e.g., wet etching, dry etching, etc.) the exposed sections of the engineered substrate 302. In other embodiments, the recesses 314 can be formed using other suitable semiconductor fabrication techniques.

Figure 5:
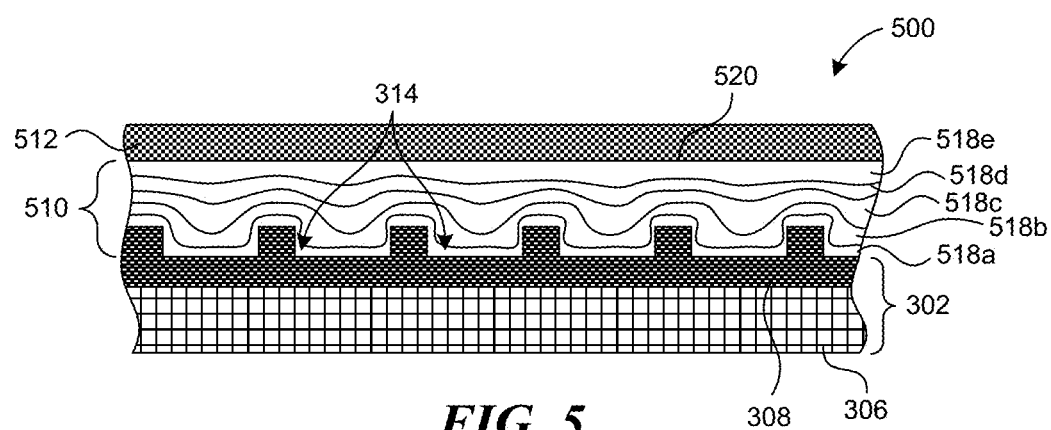
FIG. 5 is a partially schematic, cross-sectional illustration of a portion of a device assembly having epitaxial films on a patterned engineered substrate in accordance with still another embodiment of the present technology.

The patterned engineered substrate 302 can reduce stresses by breaking up or otherwise disrupting the bonding stresses that develop during epitaxial growth. FIG. 5 illustrates a representative device assembly 500 formed on the patterned engineered substrate 302. The device assembly 500 includes a buffer structure 510 and a transducer structure 512. The buffer structure 510 includes several individual epitaxial films, identified individually as first-fifth epitaxial films 518a-518e and referred to collectively as epitaxial films 518. The first epitaxial film 518a is deposited on the engineered substrate 302, and partially fills the recesses 314. The conformal shape of the first epitaxial film 518a disrupts the otherwise continuously planar first epitaxial film 518a, thus reducing (e.g., minimizing) stresses. Each successive film 518b-518e fills additional volume in the recesses 314 and is flatter than the preceding film, until the final film (e.g., the fifth film 518e) is grown with a substantially flat finished surface 520. The finished surface 520 of the final film 518e can have reduced defects due to the stress reductions in the underlying films 518a-518d, and due to being grown on an identical material. Although the illustrated embodiment includes five epitaxial films (518a-518e), other embodiments include fewer or greater numbers of epitaxial films. The device assembly 500 can be singulated to produce individual SSTs in a manner generally similar to that discussed above with reference to FIG. 2.

In the embodiments shown in FIGS. 3-5, the engineered substrate 302 includes a waffle shaped pattern. Engineered substrates in accordance with other embodiments of the present technology can employ a multitude of other patterns. For example, such substrates can include rectangular, circular, triangular, and/or other shapes or sizes of recesses to produce particular stress reducing results. Additionally, in some embodiments, the recesses 314 may not be completely surrounded by raised portions 316 (e.g., surrounded on fewer than all sides, and/or surrounded by a non-continuous raised portion on any one side). For example, the recesses 314 can be formed with gaps between individual sections of the raised portions 316. In still further embodiments, the engineered substrate 302 may be constructed to have other features that break up the continuity of the buffer structure 510 or the transducer structure 512. For example, the raised portions 316 (FIG. 3) can be formed by adding material to the engineered substrate 302 rather than removing material.

Figure 6:
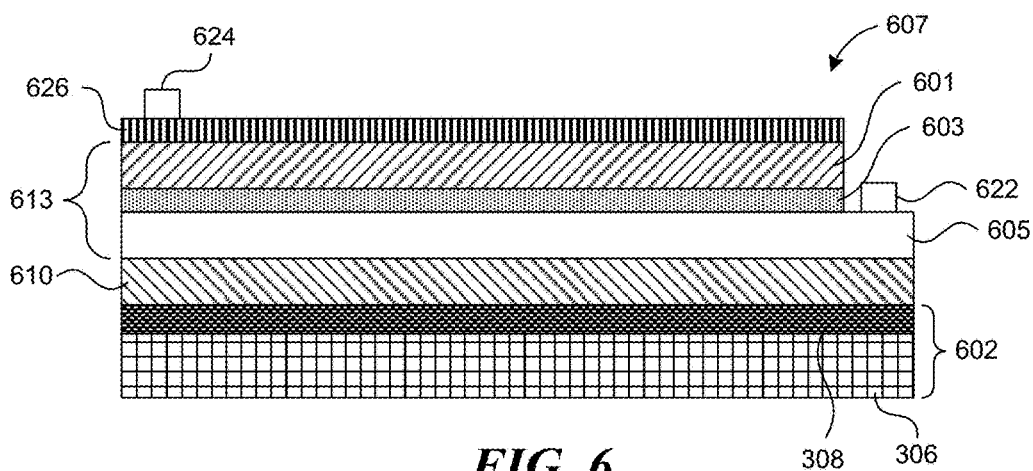
FIG. 6 is a partially schematic, cross-sectional illustration of an SST device configured in accordance with an embodiment of the present technology.

During conventional LED fabrication processes, portions of the device are constructed on substrates that are destructively removed. Embodiments in accordance with the present technology can include engineered substrates that are left in place (in whole or in part) as part of a finalized semiconductor device. For example, FIG. 6 is a partially schematic, cross-sectional illustration of an SST device 607 having an engineered substrate 602 that is left in place in accordance with another embodiment of the present technology. As shown in the illustrated embodiment, the SST device 607 includes an SST 613 (e.g., a solid state emitter that emits light). The SST device 607 has been singulated from a device assembly without removing an engineered substrate 602 and buffer structure 610 on which the SST 613 is built.

The buffer structure 610 and/or the substrate 602 may be transparent or translucent to provide desired optical properties for the device 607.

Similar to the transducer structure 212 described above with reference to FIG. 2, the SST 613 can include a P-type semiconductor material 601, an N-type semiconductor material 605 and an active region 603 between the P-type material 601 and the N-type material 605. The SST device 607 also includes a first electrode 622 electrically coupled to the N-type material 605 and a second electrode 624 electrically coupled to a contact 626 (e.g., a transparent contact) that is electrically coupled to the P-type material 601. The SST device 607 can be referred to as a lateral device because current in the SST device 607 flows across the SST 613 between the first electrode 622 and the second electrode 624.

In some embodiments, the substrate 602 and/or the buffer structure 610 can include reflective materials. In such embodiments, light emitted by the SST 613 that impinges on the buffer structure 610 or the substrate 602 is reflected back through the SST 613 and is emitted through the contact 626. Accordingly, whether the buffer structure 610 and the SST 613 are transparent, translucent, or reflective, light is at least partially emitted through the contact 626. Additionally, in some embodiments, the contact 626 can be partially opaque, and light will continue to be at least partially emitted through the contact 626. Reflective materials for the buffer structure 610 or the SST 613 can include gold (Au), copper (Cu), silver (Ag), aluminum (Al), and/or any other suitable material that reflects light emitted from the active region 603. The reflective materials can be selected based on thermal conductivity and/or the color of light they reflect. For example, silver generally does not alter the color of the reflected light. Gold, copper, or other colored reflective materials can affect the color of the light and can accordingly be selected to produce a desired color for the emitted light.

Figure 7:
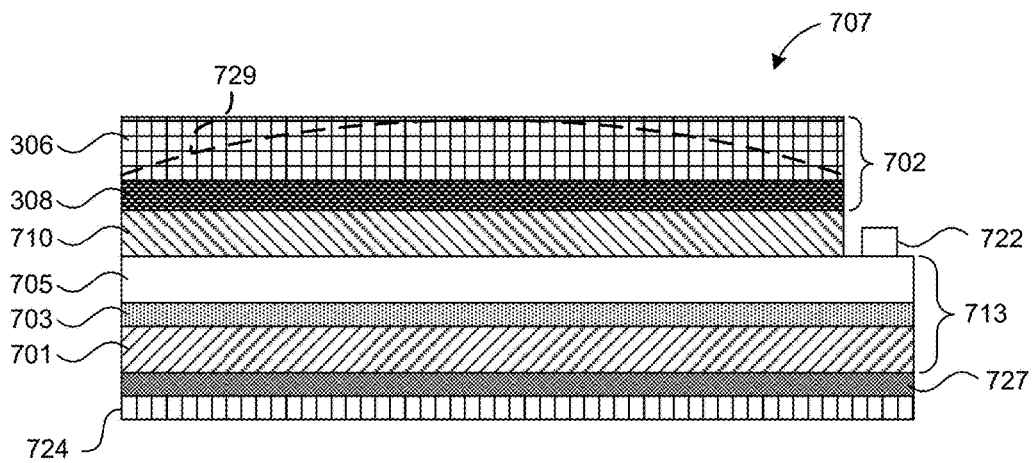
FIG. 7 is a partially schematic, cross-sectional illustration of an SST device having a lens configured in accordance with another embodiment of the present technology.

FIG. 7 is a partially schematic, cross-sectional illustration of an SST device 707 configured in accordance with another embodiment of the present technology. The illustrated embodiment includes an engineered substrate 702 (including a first material 306 and a second material 308), a buffer structure 710, and an SST 713. Similar to the SST 613 shown in FIG. 6, the SST 713 can include a P-type semiconductor material 701, an N-type semiconductor material 705 and an active region 703 between the P-type material 701 and the N-type material 705. A first electrode 722 is electrically coupled to the N-type semiconductor material 705 and a second electrode 724 is electrically coupled to a reflective contact 727 that is in turn electrically coupled to the P-type material 701. In the SST device 707, current flows vertically through the SST 713 between the first electrode 722 and the second electrode 724. Accordingly, the SST device 707 can be referred to as a vertical device. The buffer structure 710 and/or the substrate 702 may be transparent or translucent and can be shaped into one or more lenses 729 (as shown in dashed lines) to provide desired optical properties for the SST device 707. For example, the lens 729 can focus emitted light from the SST 713, thus minimizing or at least reducing the number of additional optical components necessary for a specific application. In other embodiments, the lens 729 can disperse, diffuse, color, and/or otherwise modify or adjust the emitted light, again reducing or minimizing the need for further optical components. Light emitted by the SST 713 that interacts with the reflective contact 727 is reflected back through the SST 713, thereby increasing the efficiency of the SST device 707. The lens 729 can be formed from the first material 306 or both the first and second materials 306, 308.

Other embodiments in accordance with the present technology can include lenses similar to the lens 729. The engineered substrate 602 or buffer structure 610 of the SST device 607 shown in FIG. 6, for example, can include a lens. In such an embodiment, the SST device 607 can be mounted on its side, with the engineered substrate 602 and the contact 626 both configured to pass light emitted by the active region 603.

Figure 8:
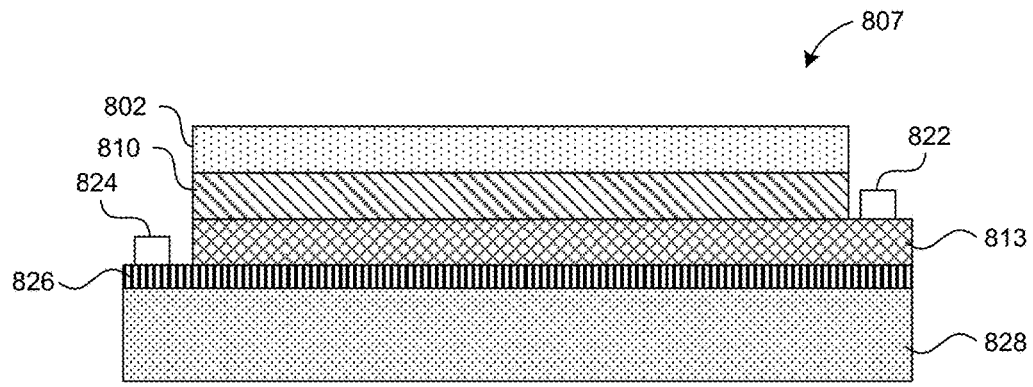
FIG. 8 is a partially schematic, cross-sectional illustration of a portion of an SST device having a nonconductive carrier substrate configured in accordance with still another embodiment of the present technology.

FIG. 8 is a partially schematic, cross-sectional illustration of an SST device 807 that includes a carrier substrate 828 facing opposite from a corresponding engineered substrate 802 in accordance with another embodiment of the present technology. The SST device 807 includes a nonconductive carrier substrate 828 and a reflective contact 826. The reflective contact 826 is electrically coupled to an SST 813. The SST device 807 further includes a buffer structure 810 and an engineered substrate 802. A first electrode 822 is electrically coupled to the SST 813 and a second electrode 824 is electrically coupled to the reflective contact 826. The nonconductive carrier substrate 828 provides a mounting surface to attach the SST device 807 to other components without introducing additional electrical paths. The SST device 807 can be mounted directly to a heat sink, for example. Additionally, the nonconductive carrier substrate 828 simplifies the mounting of multiple LEDs in series, because it eliminates unintentional electrical paths that could otherwise be formed at the backside of the device 807. Furthermore, the carrier substrate 828 of the SST device 807 can provide a contact surface that supports the SST device 807 while fabrication processes (e.g., shaping or finishing the lens) are performed on the engineered substrate 802.

Figure 9:
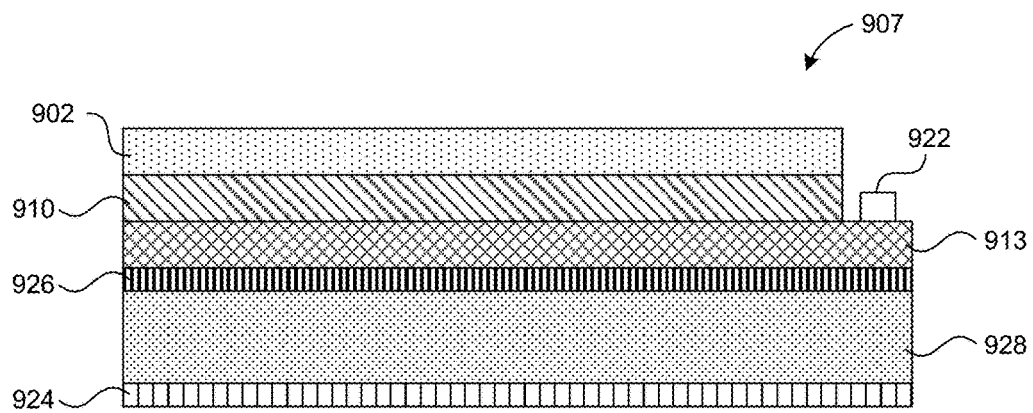
FIG. 9 is a partially schematic, cross-sectional illustration of an SST device having a conductive carrier substrate configured in accordance with yet another embodiment of the present technology.

In another embodiment shown in FIG. 9, an SST device 907 can include a conductive carrier substrate 928. Similar to the SST device 807, the SST device 907 includes an engineered substrate 902, a buffer structure 910, and a reflective contact 926 electrically coupled to an SST 913. A first electrode 922 is electrically coupled to the SST 913, and a second electrode 924 is electrically coupled to the conductive carrier substrate 928. The conductive carrier substrate 928 provides a support function during fabrication (as described above with reference to FIG. 8) and also functions to conduct current to or from the second electrode 924. Both the conductive carrier substrate 928 and the nonconductive carrier substrate 828 can be formed from a variety of materials including semiconductors, metals, metal alloys, or ceramics.

Figure 10:
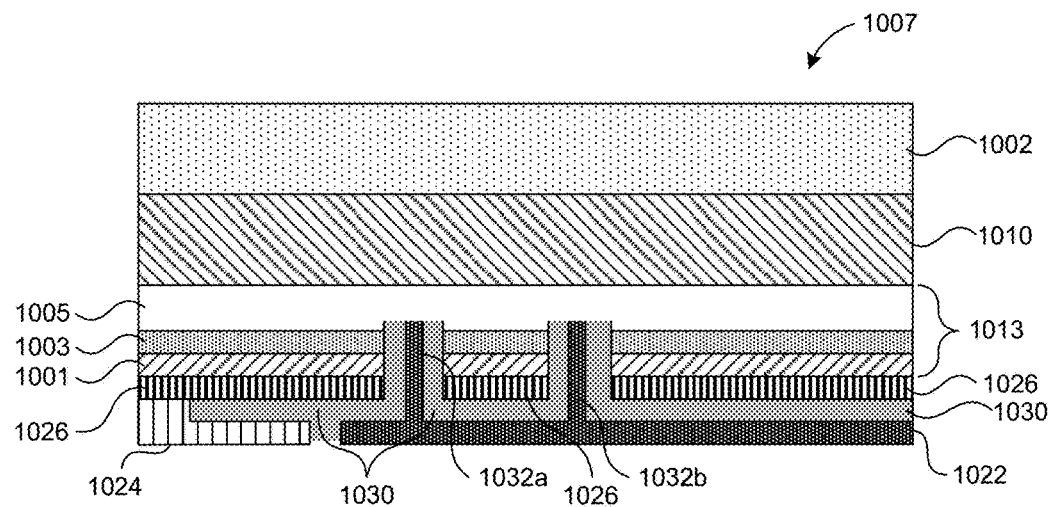
FIG. 10 is a partially schematic, cross-sectional illustration of an SST device having buried contacts configured in accordance with still another embodiment of the present technology.

Another embodiment of the present technology, shown in FIG. 10, includes buried contacts within a vertical device. A representative SST device 1007 includes an engineered substrate 1002, a buffer structure 1010, an SST 1013, and a reflective contact 1026. The SST 1013 includes a P-type semiconductor material 1001, an N-type semiconductor material 1005 and an active region 1003 between the P-type material 1001 and the N-type material 1005. A first electrode 1022 is coupled to a first buried contact 1032*a* and a second buried contact 1032*b* (collectively referred to as buried contacts 1032). An insulator 1030 separates the buried contacts 1032 from the reflective contact 1026 and from a second electrode 1024. The buried contacts 1032 are electrically coupled to the N-type material 1005. The second electrode 1024 is electrically coupled to the reflective contact 1026, and the reflective contact 1026 is electrically coupled to the P-type material 1001. The buried contacts 1032 provide multiple electrical paths to the SST 1013. Although the illustrated embodiment includes two buried contacts 1032, other embodiments may include additional buried contacts, or may include only one buried contact. The buried contacts 1032 can reduce or eliminate the tendency for the contacts to block light emitted from the SST 1013.

Figure 11:
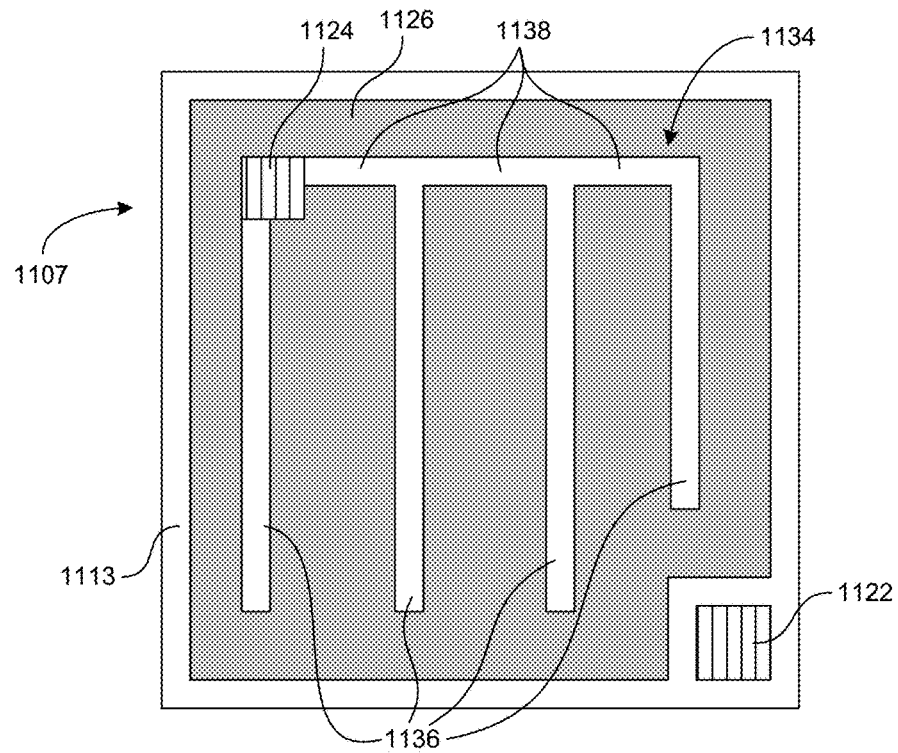
FIG. 11 is a partially schematic, top plan view of an SST device having a current spreading feature configured in accordance with yet another embodiment of the present technology.

SST devices in accordance with further embodiments of the present technology include current spreading features. FIG. 11 is a partially schematic, top plan view of an SST device 1107 having a representative current spreading feature in the form of a finger assembly 1134. The finger assembly 1134 includes a plurality of fingers 1136 connected to one another by cross members 1138. The fingers 1136 and/or the cross members 1138 can individually include an elongated structure as shown in FIG. 11 and/or other suitable structures. The fingers 1136 and/or the cross members 1138 can include copper (Cu), aluminum (Al), silver (Ag), gold (Au), platinum (Pt), and/or other suitable electrically conductive materials. In other embodiments, the finger assembly 1134 can be a transparent electrode constructed from indium tin oxide ("ITO"), aluminum zinc oxide ("AZO"), fluorine-doped tin oxide ("FTO"), and/or other substantially transparent and conductive oxides. The finger assembly 1134 is electrically coupled to a transparent contact 1126 and is configured to more evenly deliver current to the transparent contact 1126. The transparent contact 1126 is electrically coupled to a P-type material (not shown) of an SST 1113. A first electrode 1122 is electrically coupled to an N-type material (not shown) of the SST 113, and a second electrode 1124 is electrically coupled to the finger assembly 1134. The fingers 1136 and the cross members 1138 span more of the transparent contact 1126 than a traditional electrode, thereby spreading the delivered current to more regions of the transparent contact 1126 and the SST 1113. Other current spreading features may have substantially different shapes than the finger assembly 1134. For example, a pattern in the shape of a series of sine waves or a maze, or other shapes may be used.

Figure 12:
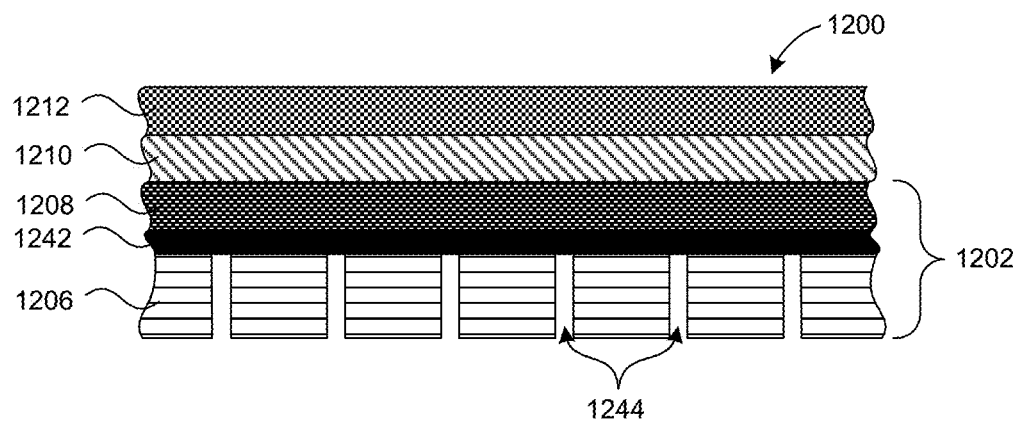
FIG. 12 is a partially schematic, cross-sectional illustration of a portion of a device assembly having a first material configured to be reused in accordance with another embodiment of the present technology.
Figure 13:
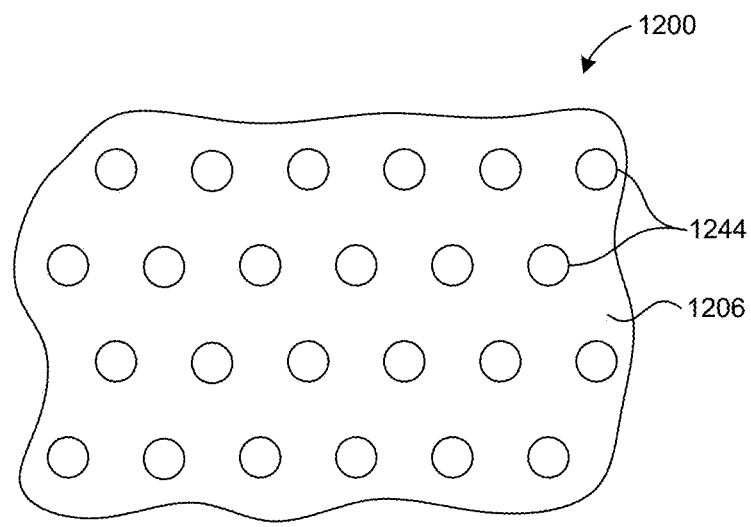
FIG. 13 is a partially schematic, bottom plan view of the device assembly of FIG. 12.

In further embodiments of the present technology, engineered substrates can be reused, at least in part, over the course of multiple fabrication cycles. FIG. 12 is a partially schematic, cross-sectional illustration of a portion of a device assembly 1200 having an engineered substrate 1202 configured to be reused in accordance with such embodiments. The device assembly 1200 includes a transducer structure 1212 and an (optional) buffer structure 1210, both carried by the engineered substrate 1202. The engineered substrate 1202 includes a separation agent 1242 disposed between a first material 1206 and a second material 1208. In a particular embodiment, the separation agent 1242 includes a material selected for its solubility characteristics, and in other embodiments, the separation agent can have other characteristics selected to facilitate the separation function it performs. FIG. 13 is a partially schematic, bottom plan view of the device assembly 1200. Referring to FIGS. 12 and 13 together, a plurality of vias 1244 penetrate the engineered substrate 1202 to the separation agent 1242. After the transducer structure 1212 is formed, a suitable solvent can be injected or otherwise provided to the vias 1244 to dissolve the separation agent 1242 and separate the first material 1206 from the second material 1208. If a suitable dissolution rate is obtained without the vias 1244, the vias 1244 can be eliminated and the separation agent 1242 can be removed form the edges of the assembly 120*a*.

Figure 14:
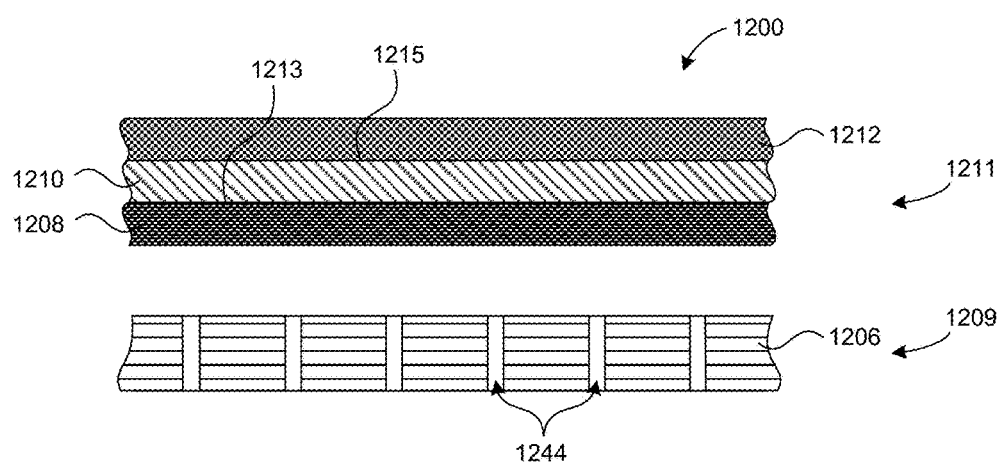
FIG. 14 is a partially schematic, cross-sectional illustration of the device assembly of FIGS. 12 and 13 after a separation.

FIG. 14 is a partially schematic, cross-sectional illustration of the device assembly 1200 after the separation agent 1242 has been removed and the engineered substrate 1202 has been split into a first portion 1209 and a second portion 1211. The first portion 1209 includes the first material 1206 of the engineered substrate 1202. The second portion 1211 includes the transducer structure 1212, the buffer structure 1210, and the second material 1208. Accordingly, the first material 1206 of the engineered substrate 1202 may be reused in the fabrication of additional transducer structures, SSTs, and/or other semiconductor devices. Disposing the separation agent 1242 between the first material 1206 and the second material 1208 allows an upper surface 1213 of the second material 1208 to be remain suitable for epitaxial growth. That is, the separation agent 1242 can be entirely removed from the first material 1206. Accordingly, the first material 1206 can receive a new second material 1208 with little or no intermediate processing, and can then be used to grow further epitaxial material for additional SSTs.

As noted, above, the separation agent 1242 can include a dissolvable material in at least some embodiments. In other embodiments, the separation agent 1242 can include implanted constituents, e.g., hydrogen or hydrogen ions that are heated to separate the adjacent portions of the engineered substrate 1202. In still other embodiments the separation agent can be disposed between the buffer structure 1210 and the second material 1208. In such an embodiment, an upper surface 1215 of the buffer structure 1210 is accessible for subsequent for epitaxial growth.

In some embodiments, the engineered substrate 1202 can undergo additional processing prior to a subsequent fabrication cycle. For example, the engineered substrate 1202 can be patterned in a manner similar to that described above with reference to FIGS. 3-5. If the separation agent 1242 separates the patterned portion of the engineered substrate 1202 from the remainder of the engineered substrate 1202, the engineered substrate 1202 can be re-patterned prior to further fabrication. Additionally, surfaces of the engineered substrate 1202 can undergo chemical-mechanical planarization (CMP) to resurface the engineered substrate 1202. Such resurfacing can be used, for example, to prepare the engineered substrate 1202 for receiving an additional second material 1208 and separation agent 1242. Similarly, in embodiments for which the separation agent 1242 is disposed between the buffer structure 1210 and the second material 1208, the additional processing can include resurfacing the second material 1208 to prepare for refabricating the buffer structure 1210.

The above description discloses several advantageous features associated with engineered substrates, which can be implemented separately or in any of a variety of combinations. These features include the ability to reduce stresses in overlying epitaxial materials by matching or approximately matching the CTE of the engineered substrate with that of the overlying materials, in combination with additional stress-reduction features, including disrupting stress build-up with surface features (as discussed above with reference to FIGS. 3-5) and/or lattice matching the epitaxial growth surface (e.g., the surface of the second material) to the lattice characteristics of the subsequently grown materials. The ability to select the second material to have characteristics that enhance these functions provides a significant advantage over non-engineered substrates. Furthermore, as discussed above some or all of the engineered substrate can remain attached to the final device after manufacturing has been completed. The attached engineered substrate can be selected and/or processed to provide additional functions, e.g., to modify the light emitted from a solid state lighting device. If only a portion of the engineered substrate remains attached to the final device, the removed portion can be re-used to form additional devices, thus reducing material and manufacturing costs.

From the foregoing it will be appreciated that specific embodiments of the disclosed technology have been described herein for purposes of illustration, but that various modifications may be made without deviating from the disclosure. For example, the engineered substrates, buffer structures, transducer structures, device assemblies, and SSTs disclosed herein can be configured in a variety of manners. Patterned recesses, and/or raised portions with different sizes and/or shapes, for example, may be used in different embodiments. Additionally, other materials may be used in place of those described herein, or additional components may be added or removed. For example, although an illustrated embodiment includes a series of vias that are sequentially spaced within the engineered substrate, other embodiments may use a single via, or a different pattern. Furthermore, device assemblies with engineered substrates in accordance with the present technology may be configured to be separated and reused by additional methods. For example, in addition to methods and systems employing hydrogen implantation or a dissolvable material, embodiments in accordance with the present technology can include laser lift-off techniques. Moreover, while various advantages and features associated with certain embodiments have been described above in the context of those embodiments, other embodiments may also exhibit such advantages and/or features, and not all embodiments need necessarily exhibit such advantages and/or features to fall within the scope of the technology. Accordingly, the disclosure and associated technology can encompass other embodiments not expressly shown or described herein.

We claim:

1. A method for fabricating semiconductor devices, the method comprising:
    forming an engineered substrate having a first layer comprising a first material, a second layer comprising a second material, and a third layer comprising a dissolvable material and disposed between the first layer and the second layer;
    forming a first buffer structure on the second layer;
    forming a first transducer structure on the first buffer structure, the first transducer structure having a plurality of semiconductor materials including a radiation-emitting active region, wherein at least one of the first material and the second material in the engineered substrate has a coefficient of thermal expansion approximately matched to a coefficient of thermal expansion of at least one of the plurality of semiconductor materials;
    forming a reflective contact electrically coupled to a first semiconductor material of the plurality of semiconductor materials;
    forming an insulating layer on the reflective contact;
    forming a plurality of buried contacts electrically coupled to a second semiconductor material of the plurality of semiconductor materials, wherein each buried contact passes through the insulating layer, the reflective contact and the first semiconductor material of the plurality of semiconductor materials, and wherein a first end of each buried contact protrudes into the second semiconductor material of the plurality of semiconductor materials, and a second end of each buried contact protrudes through the insulating layer;
    forming a first electrode on the insulating layer, wherein the first electrode is electrically and physically coupled to the second end of each buried contact;
    forming a second electrode electrically coupled to the reflective contact, wherein a portion of the second electrode is over the insulating layer; and exposing the third layer to a solvent to dissolve the dissolvable material in the third layer, thereby separating the first layer from the second layer.

2. The method of claim 1, further comprising forming a plurality of vias in the first layer, wherein exposing the third layer to the solvent includes introducing the solvent into the vias to expose the third layer to the solvent.

3. The method of claim 1 wherein the first material comprises polycrystalline aluminum nitride, and the second material comprises silicon.

4. A method for fabricating semiconductor devices, the method comprising:
   forming an engineered substrate having a first layer comprising a first material, a second layer comprising a second material, and a third layer comprising implanted hydrogen and disposed between the first layer and the second layer;
   forming a first buffer structure on the second layer;
   forming a first transducer structure on the first buffer structure, the first transducer structure having a plurality of semiconductor materials including a radiation-emitting active region, wherein at least one of the first material and the second material in the engineered substrate has a coefficient of thermal expansion approximately matched to a coefficient of thermal expansion of at least one of the plurality of semiconductor materials;
   forming a reflective contact electrically coupled to a first semiconductor material of the plurality of semiconductor materials;
   forming an insulating layer on the reflective contact;
   forming a plurality of buried contacts electrically coupled to a second semiconductor material of the plurality of semiconductor materials, wherein each buried contact passes through the insulating layer, the reflective contact and the first semiconductor material of the plurality of semiconductor materials, and wherein a first end of each buried contact protrudes into the second semiconductor material of the plurality of semiconductor materials, and a second end of each buried contact protrudes through the insulating layer;
   forming a first electrode on the insulating layer, wherein the first electrode is electrically and physically coupled to the second end of each buried contact;
   forming a second electrode electrically coupled to the reflective contact, wherein a portion of the second electrode is over the insulating layer; and
   heating the third layer to cause the implanted hydrogen to expand, thereby separating the first layer from the second layer.

5. The method of claim 4 wherein the first material comprises polycrystalline aluminum nitride, and the second material comprises silicon.

* * * * *